United States Patent
Shi et al.

(10) Patent No.: US 7,192,291 B2
(45) Date of Patent: Mar. 20, 2007

(54) COVER MOUNTING ASSEMBLY

(75) Inventors: Zheng Shi, Guangdong (CN);
Zhi-Gang Chen, Guangdong (CN);
Xiong-Dong Peng, Guangdong (CN);
Ke-Cheng Lin, Guangdong (CN);
Chien-Li Tsai, Guangdong (CN)

(73) Assignees: Hong Fu Jin Precision Industry (Shen Zhen) Co., Ltd., Shenzhen (CN); Hon Hai Precision Industry Co., Ltd, Tu-Cheng (TW)

( * ) Notice: Subject to any disclaimer, the term of this patent is extended or adjusted under 35 U.S.C. 154(b) by 0 days.

(21) Appl. No.: 11/306,965

(22) Filed: Jan. 17, 2006

(65) Prior Publication Data
US 2006/0234545 A1 Oct. 19, 2006

(30) Foreign Application Priority Data
Apr. 15, 2005 (CN) .................. 2005 2 0057327 U

(51) Int. Cl.
*H01R 13/44* (2006.01)

(52) U.S. Cl. ....................................... 439/135

(58) Field of Classification Search ................ 439/135, 439/136; 429/100, 97
See application file for complete search history.

(56) References Cited

U.S. PATENT DOCUMENTS 5,244,755 A * 9/1993 Benoist et al. ................ 429/97
5,882,816 A * 3/1999 Gotou ......................... 429/100
6,660,427 B1 * 12/2003 Hukill et al. .................. 429/97
7,043,282 B2 * 5/2006 Inomata et al. ........... 455/575.1
2006/0141344 A1 * 6/2006 Chen et al. .................... 429/97
2006/0172183 A1 * 8/2006 Chen et al. .................... 429/97

FOREIGN PATENT DOCUMENTS

TW 592021 6/2004

* cited by examiner

*Primary Examiner*—Michael C. Zarroli
*Assistant Examiner*—Phuongchi Nguyen
(74) *Attorney, Agent, or Firm*—Winston Hsu

(57) ABSTRACT

A cover mounting assembly includes a button (20), a cover (40), a locking member (60) and a base plate (70). The cover includes a pair of hooks (49). The locking member includes a lockpin (65). The locking member is attached with the button on the opposite surfaces of the cover to slide forward or rearward together. The base plate includes an opening (71) and a pair of slots (77). The cover is received in the opening of the base plate and the hooks are received in the slots of the base plate respectively. The lockpin of the locking member abuts against the internal surface of the base plate to fasten the cover to the base plate.

19 Claims, 4 Drawing Sheets

COVER MOUNTING ASSEMBLY

DESCRIPTION

1. Field of the Invention

The present invention relates to a cover mounting assembly, and more particularly to a cover mounting assembly which is applied to a portable electronic device to prevent dust.

2. Description of the Related Art

Generally, a base plate of portable electronic device forms several receiving spaces for receiving components, such as batteries, memories, hard disks, and heat sinks. When the components are received in the corresponding receiving spaces, in order to protect the components and prevent the dust in the air coming into the receiving spaces to contaminate and even damage the portable electronic device, each opening of the receiving spaces is covered by a cover.

Some covers of the openings are secured on the base plate by screws. However, to take out the covers, users have to find a screwdriver to unscrew the screws, and it is very inconvenient for the users.

What is desired, therefore, is a cover mounting assembly which has no screws.

SUMMARY OF INVENTION

In one preferred embodiment, a cover mounting assembly includes a button, a cover, a locking member and a base plate. The cover includes a pair of hooks. The locking member includes a lockpin. The locking member is attached with the button on the opposite surfaces of the cover to slide forward or rearward together. The base plate includes an opening and a pair of slots. The cover is received in the opening of the base plate and the hooks are received in the slots of the base plate respectively. The lockpin of the locking member abuts against the internal surface of the base plate to fasten the cover to the base plate.

Other advantages and novel features will become more apparent from the following detailed description of preferred embodiments when taken in conjunction with the accompanying drawings, in which:

DETAILED DESCRIPTION

Figure 1:
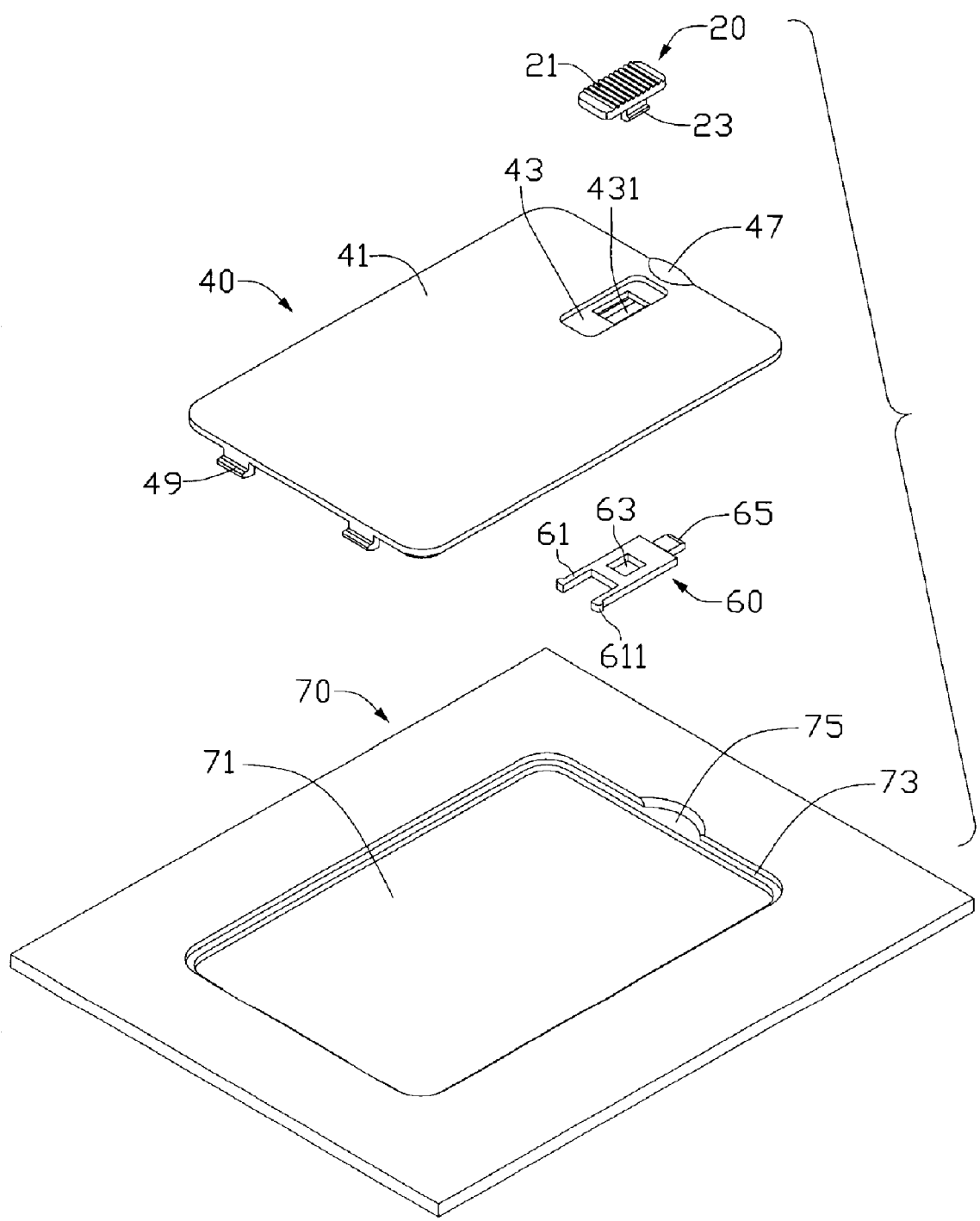
FIG. 1 is an exploded, isometric view of a cover mounting assembly with a locking member in accordance with a preferred embodiment of the present invention.
Figure 2:
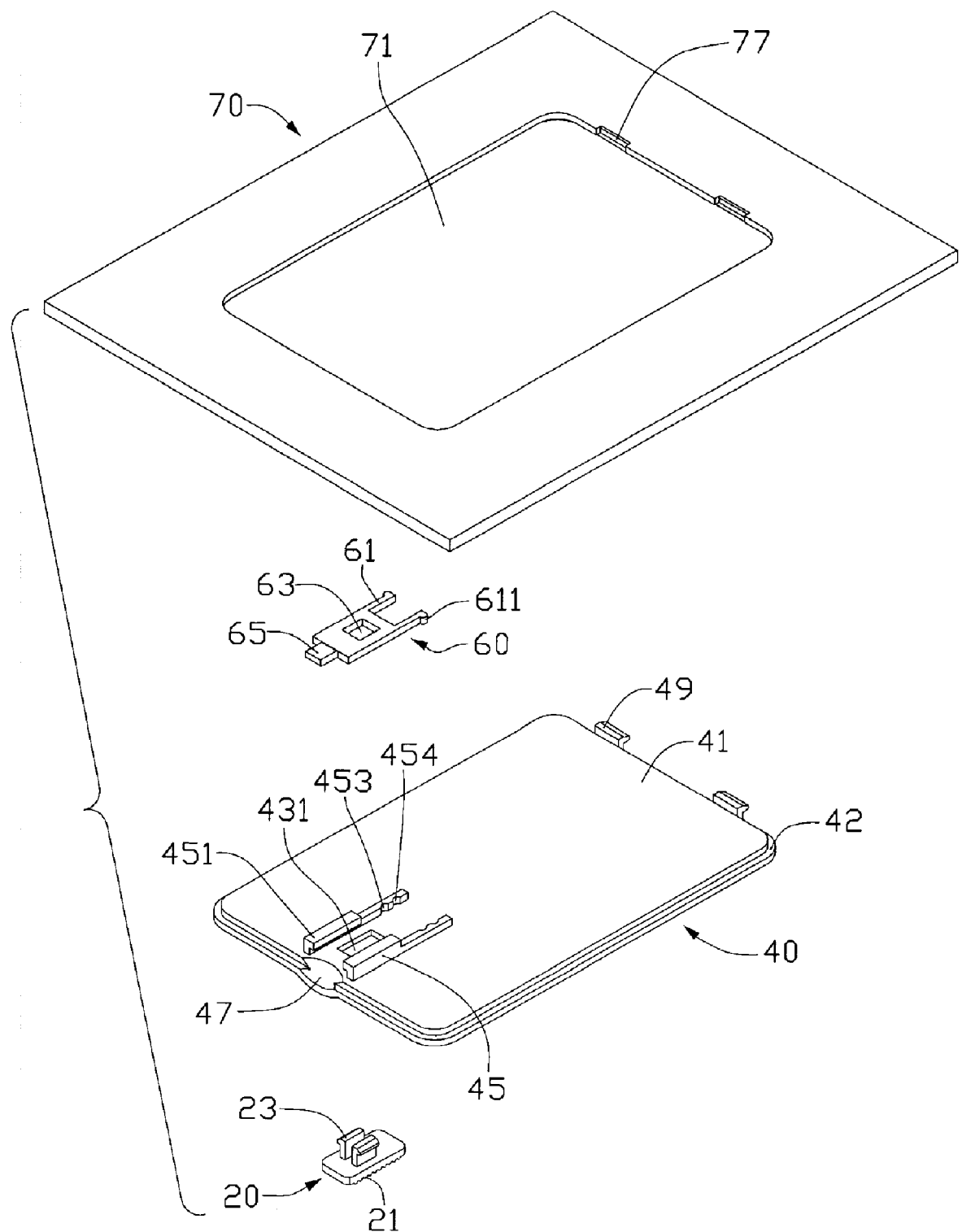
FIG. 2 is similar to FIG. 1, but from another aspect.

Referring to FIGS. 1 and 2, a cover mounting assembly in accordance with a preferred embodiment of the present invention includes a button 20, a cover 40, a locking member 60 to be slidably assembled on the cover 40 by the button 20, and a base plate 70 of a portable electronic device with an opening 71 for receiving the cover 40. The cover mounting assembly protects internal components of the portable electronic device, and also prevents the dust coming into the portable electronic device.

The button 20 includes a pushing portion 21 and a pair of flexible catches 23 formed at opposite sides of the pushing portion 21.

The cover 40 includes a rectangular main body 41 with stepped side edges 42. A receiving portion 43 is formed at a front portion of the main body 41, and a through hole 431 is defined in the receiving portion 43 corresponding to the catches 23 of the button 20. A pair of fixing portions 45 is formed from the internal surface of the cover 40, and each fixing portion 45 includes an L-shaped tab 451 at a front end thereof. A first cutout 453 and a second cutout 454 are formed at a rear end of each fixing portion 45. An operating portion 47 is formed from a front edge of the cover 40 for a finger of a user, and a pair of hooks 49 extends from a rear edge of the cover 40.

The locking member 60 includes a pair of fastening feet 61 extending from its rear end. Each fastening foot 61 includes a latch 611 corresponding to the first cutout 453 and the second cutout 454 of the cover 40. An aperture 63 is defined in the locking member 60 corresponding to the through hole 431 of the cover 40 and the catches 23 of the button 20. A lockpin 65 protrudes outward from a front end of the locking member 60.

The base plate 70 defines an opening 71 for receiving the cover 40, and the opening 71 includes edges 73 mating with the side edges 42 of the cover 40. A recess 75 is defined in an external surface of the base plate 70 adjacent a front portion of the opening 71 corresponding to the operating portion 47 of the cover 40. A pair of slots 77 is defined in an internal surface of the base plate 70 adjacent a rear portion of the opening 71 corresponding to the hooks 49 of the cover 40.

Figure 3:
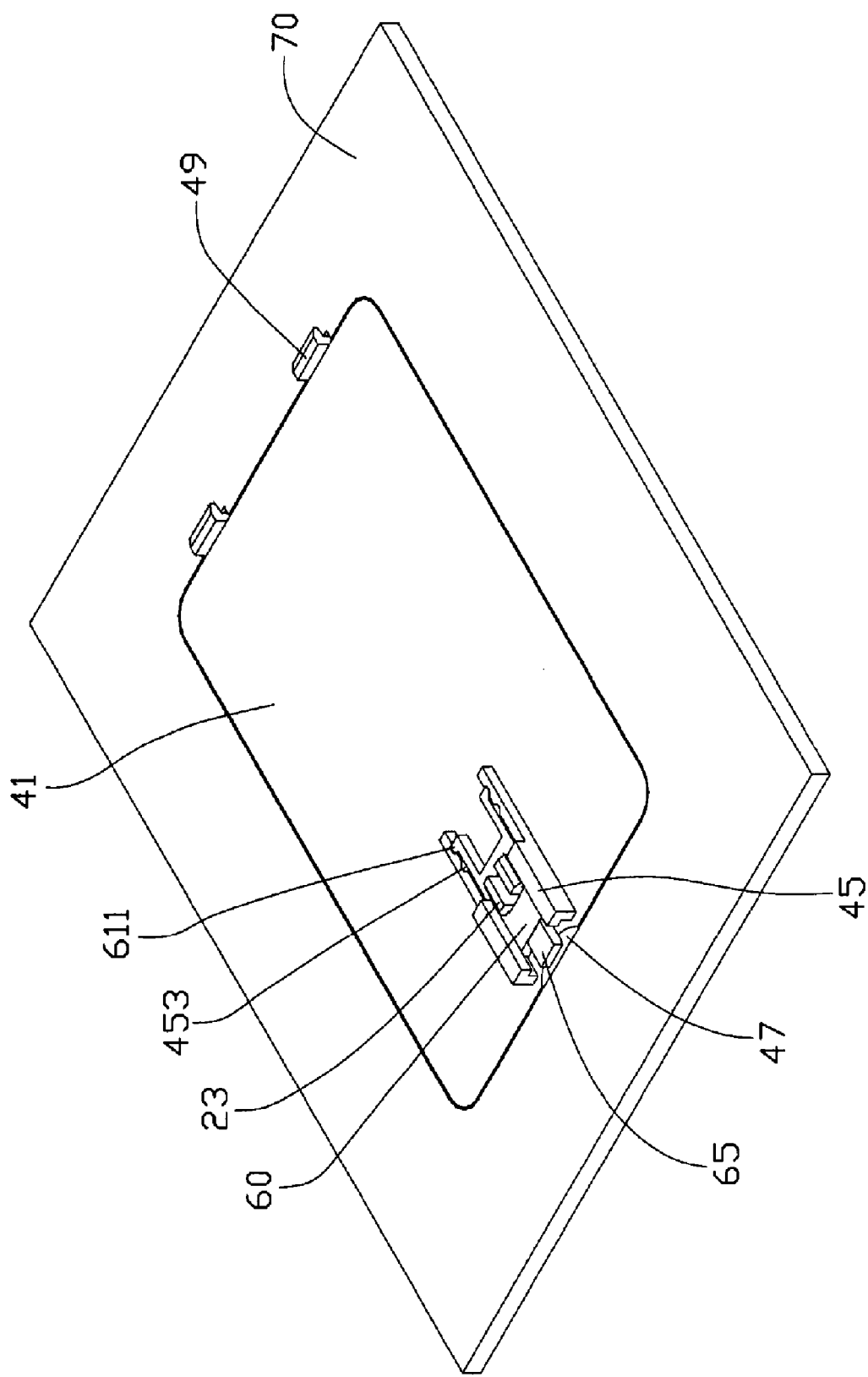
FIGS. 3 and 4 are assembled views of FIG. 2, respectively schematically showing the locking member in different working states.

As shown in FIG. 3, in assembly, the locking member 60 is received between the fixing portions 45, the latches 611 are locked into the second cutouts 454 of the fixing portions 45 respectively, and the tabs 451 prevent a movement of the locking member 60 in a direction vertical to the cover 40. The catches 23 of the button 20 extend through the through hole 431 of the cover and the aperture 63 of the locking member 60, catch a surface of the locking member 60, thus the button 20 is received in the receiving portion 43 and is slidably attached to the cover 40.

Figure 4:
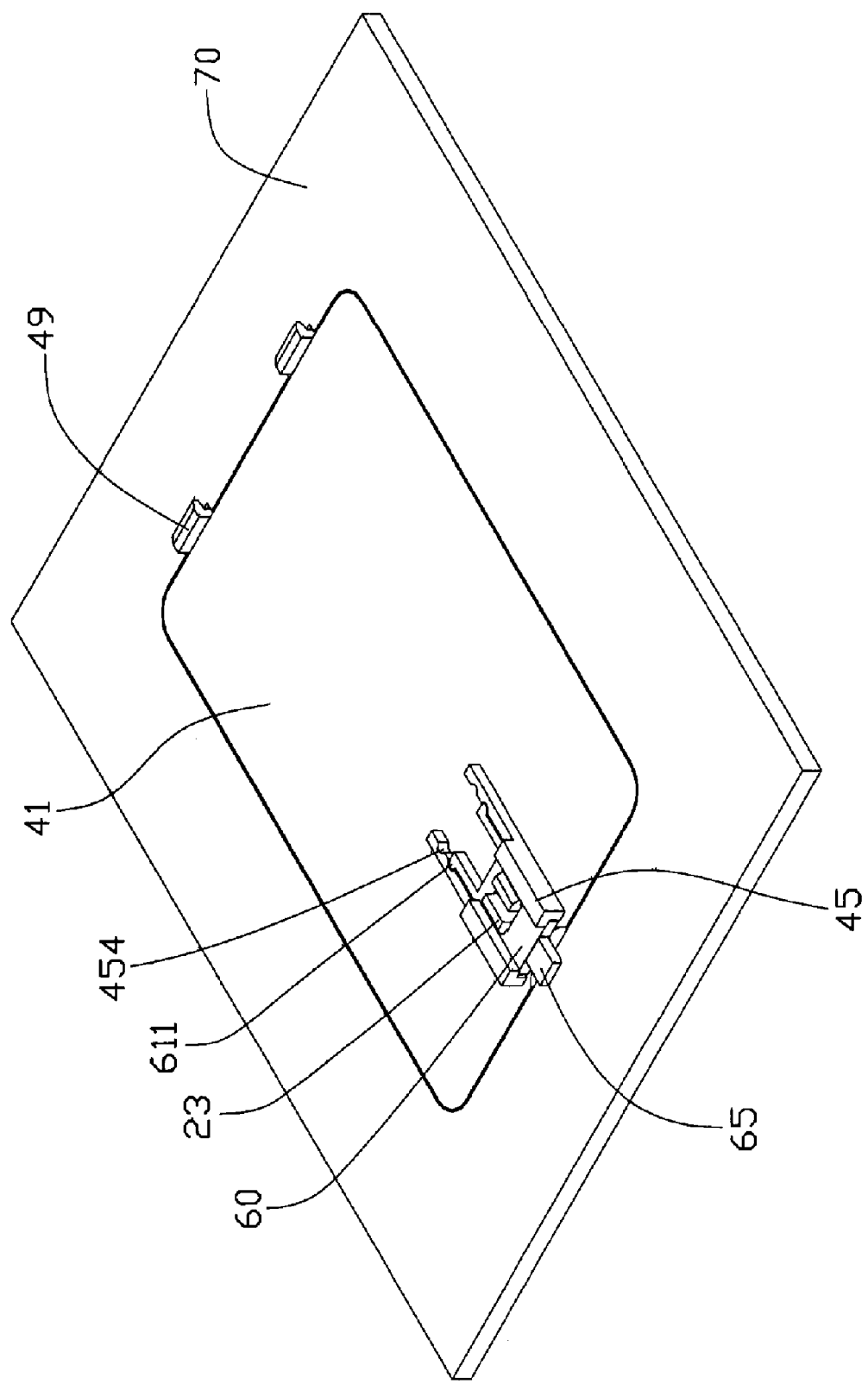

As shown in FIG. 4, to mount the cover 40 to the base plate 70, the hooks 49 of the cover 40 are received in the slots 77 of the base plate 70 respectively, and the cover 40 covers the opening 71 of the base plate 70. The pushing portion 21 of the button 20 is pushed forward to drive the locking member 60 forward, the lockpin 65 thus abuts against the internal surface of the base plate 70 thereby and fastens the cover 40 to the base plate 70. The latches 611 are locked into the first cutouts 454 of the fixing portions 45 respectively to prevent the locking member 60 sliding backward.

To take out the cover 40 from the base plate 70, the pushing portion 21 of the button 20 is pushed backward to drive the locking member 60 rearward, and the cover 40 is released by the lockpin 65 of locking member 60. The latches 611 are locked into the second cutouts 453 of the fixing portions 45 respectively. The operating portion 47 is pulled upward, and the cover 40 is removed from the base plate 70.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A cover mounting assembly comprising:
   a base plate comprising an opening and a pair of slots;
   a cover receiving in the opening of the base plate, the cover comprising a pair of hooks received in the slots of the base plate respectively;
   a button; and
   a locking member attached with the button on the opposite surfaces of the cover to slide forward or rearward together, the locking member comprising a lockpin, wherein the lockpin abuts against the internal surface of the base plate to fasten the cover to the base plate;
   wherein the cover comprises a pair of fixing portions, and the locking member is received between the fixing portions.

2. The cover mounting assembly as claimed in claim 1, wherein the button comprises a pair of flexible catches, the cover comprises a through hole, the locking member comprises an aperture, the catches of the button extend through the through hole of the cover and the aperture of the locking member to catch a surface of the locking member, and the button is slidably attached to the cover.

3. The cover mounting assembly as claimed in claim 1, wherein the cover comprises a receiving portion, and the button is slidably received in the receiving portion of the cover.

4. The cover mounting assembly as claimed in claim 1, wherein an operating portion is formed on a front edge of the cover for a finger of a user, and a recess is defined in an external surface of the base plate corresponding to the operating portion of the cover.

5. The cover mounting assembly as claimed in claim 1, wherein the button comprises a pushing portion, the pushing portion is pushed by a user to control the button on a locking state or an unlocking state.

6. The cover mounting assembly as claimed in claim 1, wherein the cover comprises stepped side edges, and the edges of the opening of the base plate have a sharp mating with the side edges of the cover.

7. The cover mounting assembly as claimed in claim 1, wherein each of the fixing portions comprises a first cutout, the locking member comprises a pair of fastening feet extending from its rear end, and each of the feet forms a latch received in the corresponding first cutout to keep the locking member at a locking state.

8. The cover mounting assembly as claimed in claim 7, wherein each of the fixing portions comprises a second cutout, and the latches of the locking member are received in the second cutouts to keep the locking member at an unlocking state.

9. A cover mounting assembly comprising:
   a base plate defining an opening;
   a cover attaching to the base plate and receiving in the opening;
   a locking member comprising a lockpin, the locking member slidably attached to the cover, and the lockpin abuts against the internal surface of the base plate to fasten the cover to the base plate; and
   a button attaching with the locking member on the opposite surfaces of the cover to drive the locking member forward or rearward;
   wherein the button comprises a pair of flexible catches, the cover comprises a through hole, the locking member comprises an aperture, the catches of the button extend through the through hole of the cover and the aperture of the locking member to catch a surface of the locking member, and the button is slidably attached to the cover.

10. The cover mounting assembly as claimed in claim 9, wherein the cover comprises a receiving portion, and the button is slidably received in the receiving portion of the cover.

11. The cover mounting assembly as claimed in claim 9, wherein the cover comprises stepped side edges, and the edges of the opening of the base plate have a sharp mating with the side edges of the cover.

12. The cover mounting assembly as claimed in claim 9, wherein the cover comprises a pair of hooks, and the base plate comprises a pair of slots receiving the hooks respectively.

13. The cover mounting assembly as claimed in claim 9, wherein the cover comprises a pair of fixing portions, and the locking member is received between the fixing portions.

14. The cover mounting assembly as claimed in claim 9, wherein each of the fixing portions comprises a first cutout, the locking member comprises a pair of kistening feet extending from its rear end, and each of the feet forms a latch received in the corresponding first cutout to keep the locking member at a locking state.

15. The cover mounting assembly as claimed in claim 14, wherein each of the fixing portions comprises a second cutout, and the latches of the locking member are received in the second cutouts to keep the locking member at an unlocking state.

16. A cover mounting assembly comprising:
   a base plate defining an outer surface and an inner surface opposing to the outer surface, a through opening extending through the outer and inner surfaces;
   a cover attached to the base plate from the outer surface thereof to cover the opening;
   a locking member disposed at an inner side of the cover and comprising a lockpin;
   a button separatable from the locking member disposed at an outer side of the cover the button being detachably locked with the locking member and capable of driving the locking member to move relative to the cover and the base plate in a front-and-back direction to cause the lockpin to lock or unlock with the base plate; and
   a stopping structure formed on the cover and configured for keeping the locking member at a locking state at which the lockpin is locked with the base plate.

17. The cover mounting assembly as claimed in claim 16, wherein the cover defines a through hole, the button comprises a catch extending through the through hole to lock with the locking member.

18. The cover mounting assembly as claimed in claim 16, wherein the stopping structure comprises a cutout defined at the cover, and one of the locking member and the button has a projection received in the cutout when the locking member is at the locking state.

19. The cover mounting assembly as claimed in claim 18, wherein the cover further defines another cutout, and the projection is engaged in the another cutout when the locking member is at unlocking state at which the lockpin is unlocked with the base plate.

* * * * *